United States Patent [19]
Kokubo et al.

[11] Patent Number: 5,380,618
[45] Date of Patent: Jan. 10, 1995

[54] MICROPATTERN-FORMING MATERIAL HAVING A LOW MOLECULAR WEIGHT NOVOLAK RESIN, A QUINONE DIAZIDE SULFONYL ESTER AND A SOLVENT

[75] Inventors: Tadayoshi Kokubo; Kazuya Uenishi; Shiro Tan; Wataru Ishii, all of Shizuoka, Japan

[73] Assignee: Fuji Photo Film Co., Ltd., Kanagawa, Japan

[21] Appl. No.: 230,020

[22] Filed: Apr. 19, 1994

Related U.S. Application Data

[63] Continuation of Ser. No. 985,453, Dec. 3, 1992, abandoned, which is a continuation of Ser. No. 500,348, Mar. 28, 1990, abandoned.

[30] Foreign Application Priority Data

Mar. 29, 1989 [JP] Japan .................................. 1-77899

[51] Int. Cl.$^6$ ........................ G03F 7/023; G03F 7/30
[52] U.S. Cl. ................................... 430/190; 430/165; 430/191; 430/192; 430/193
[58] Field of Search ............... 430/190, 191, 192, 193, 430/165

[56] References Cited

U.S. PATENT DOCUMENTS

| | | | |
|---|---|---|---|
| 3,666,473 | 5/1972 | Colom et al. | |
| 4,377,631 | 3/1983 | Toukhy et al. | 430/192 |
| 4,529,682 | 7/1985 | Toukhy | 430/192 |
| 4,626,492 | 12/1986 | Eilbeck | |
| 4,847,178 | 7/1989 | Komano | 430/190 |
| 4,863,829 | 9/1989 | Furuta et al. | 430/192 |
| 4,883,739 | 11/1989 | Sakaguchi et al. | 430/193 |
| 4,906,549 | 3/1990 | Asaumi et al. | 430/193 |
| 4,943,511 | 7/1990 | Lazarus et al. | 430/192 |
| 4,957,846 | 9/1990 | Jeffries, III et al. | 430/190 |
| 4,959,292 | 9/1990 | Blakeney et al. | 430/192 |
| 4,965,167 | 10/1990 | Salamy et al. | 430/193 |

FOREIGN PATENT DOCUMENTS

| | | |
|---|---|---|
| 0212482 | 8/1986 | European Pat. Off. |
| 9001726 | 2/1990 | WIPO |

OTHER PUBLICATIONS

European Search Report, 90106075.6, Vienna, Jul. 29, 1991, Hammer.
Chemical Abstracts, vol. 108, No. 26, Jun. 27, 1988, p. 535, No. 229671r.
Chemical Abstracts, vol. 109, No. 20, Nov. 14, 1988, p. 684, No. 180449d.
Chemical Abstracts, vol. 105, No. 16, Oct. 20, 1986, p. 654, No. 143595v.
Chemical Abstracts, vol. 102, No. 8, Feb. 25, 1985, p. 543, No. 70249m.

*Primary Examiner*—Charles L. Bowers, Jr.
*Assistant Examiner*—John S. Chu
*Attorney, Agent, or Firm*—Sughrue, Mion, Zinn, Macpeak & Seas

[57] ABSTRACT

A micropattern-forming, light sensitive resin composition is disclosed. The composition comprises (a) a novolak resin comprising a condensate between formaldehyde and a mixture of m-cresol and p-cresol with a m-cresol to p-cresol charging weight ratio of from 45/55 to 60/40, wherein the novolak resin has the following characteristics: (i) a dissolving rate of 20 to 800 Å/sec in an aqueous solution of tetramethylammonium hydroxide (TMAH) and an alkali activity of 0.131N, (ii) a weight average molecular weight of 1000 to 6000 calculated as polystyrene equivalent, and (iii) a non-exposed dissolving rate of equal to or more than 100 Å/sec in an aqueous solution of TMAH with an alkali activity of 0.262N; (b) a light-sensitive substance of 1,2-naphthoquinonediazide-4-sulfonyl ester, and (c) a solvent capable of dissolving the novolak resin and the light-sensitive substance; wherein the novolak resin, the light-sensitive substance, and the solvent are present in such amounts that a 1.0 micron thick resist formed of the material has an optical density at 382 nm of 0.1 to 0.4 $\mu m^{-1}$. Also described is a micropattern-forming process having the steps of: (1) spin coating a substrate with the light-sensitive resin composition; (2) drying the light-sensitive composition; (3) exposing the dried light-sensitive composition using deep UV having a wavelength not longer than about 320 nm; and (4) developing the exposed light-sensitive composition.

7 Claims, No Drawings

MICROPATTERN-FORMING MATERIAL HAVING A LOW MOLECULAR WEIGHT NOVOLAK RESIN, A QUINONE DIAZIDE SULFONYL ESTER AND A SOLVENT

This is a continuation of application Ser. No. 07/985,453 filed on Dec. 3, 1992, now abandoned, which is a continuation application of Ser. No. 07/500,348 filed Mar. 28, 1990, now abandoned.

FIELD OF THE INVENTION

This invention relates to a micropattern-forming material for use in manufacturing semiconductor elements and, more particularly, to a resist material for forming a micropattern using a deep UV actinic ray of around 250 nm in wavelength such as an oscillation light of an excimer laser and the process of using this resist to form a micropattern.

BACKGROUND OF THE INVENTION

Photoresists capable of forming a super-fine pattern with excellent resolving power and good rectangular section have been developed in rapid succession for the purpose of manufacturing ultra-large scale integration 4M-bit or 16M-bit semiconductor elements. These photoresists have been designed for optical exposure techniques using g line or i line. Materials for forming such photoresists contain a novolak resin and a naphthoquinonediazide compound as the fundamental constituents. It is well known that the solubility of these photoresists in alkali is decelerated in an unexposed state by the inhibition effect due to mutual action between the fundamental constituents and is accelerated in a light-struck state by carboxylic acid produced from the photolysis of the naphthoquinonediazide compound.

It is widely accepted that micropattern formation can be accomplished using photo lithography and an appropriate resist. However, devices capable of producing super-fine dimensions of less than a half-micron are considered impossible using conventional exposure techniques with a g line or i line regardless of advances in stepper apparatus technology (for example, increase in NA value or improvement in manufacturing processes) because these techniques are approaching the limit of the wavelength of light. Considering current manufacturing techniques, however, it appears that micropattern formation by light exposure techniques will remain important. A light source that has attracted attention to replace the g line or i line is deep UV, particularly from an excimer laser of KrF, ArF or the like because it offers a solution to the problem of wavelength. In order to use deep UV, many problems must be overcome. In particular, at present there are no resists adapted for use with deep UV such as produced by an excimer laser.

When an existing g line resist is used as a resist for an excimer laser, a triangular pattern profile results instead of a rectangular pattern profile. This results because both the novolak resin and the light-sensitive substance that constitute a g line resist show strong absorption around the wavelength of 250 nm. Thus, the resist absorbs the incident light so much that the incident light fails to fully reach the substrate surface. This results in an exposure gradient in the thickness of the resist. Because of this, commercially available resists provide a rectangular profile only when their thickness is 0.5 μm or less. In addition, even when the upper portion of the pattern has a rectangular profile, the lower portion thereof fans out toward the bottom, which makes them impractical for micropatterns.

Attempts to solve this problem have involved combining a light-sensitive substance showing good bleachability with a polymer showing less absorption around the wavelength of the exposing light (for example, a combination of an imide-containing polymer and a photoacid as described in JP-A-62-229242 (the term "JP-A" as used herein means an "unexamined published Japanese patent application") which corresponds to U.S. Pat. No. 4,837,124; a combination of a light-sensitive substance having a linkage of

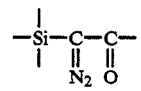

and a less absorbing polymer as described in JP-A-62-235935; and a combination of a light-sensitive substance having a linkage of

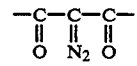

and a less absorbing polymer described in JP-A-63-240543).

An example of the less absorbing polymer is a phenol-cresol novolak resin such as an o-chloro-m-cresol resin and a polymer having the structure of:

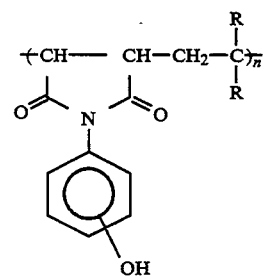

In addition, JP-A-61-126549 discloses obtaining a pattern having an improved profile by using a dilute alkali developer under controlled developing conditions.

In general, it is considered important for resists for excimer laser lithography to ideally satisfy the following three requirements:

(1) have good plasma resistance;
(2) be developable with an alkali solution; and
(3) have high resolving power and form a rectangular profile.

Materials that satisfy all these requirements have yet to be found.

The m/p-cresol novolak resins are widely used as constituents of positive resists. In designing materials for lithography using deep UV, it had been believed advantageous to use m/p-cresol novolak resins containing p-cresol as a major component (Materials for Microlithography, P340ACS Symposium Series 266, ACS, 1984). This belief comes from the fact that, comparison of m/p-cresol novolak resins shows cresol novolak resins composed of 100% p-cresol or mainly p-cresol exhibit less absorption in the deep UV than the popularly used m/p-cresol novolak resins.

Attempts were also made to overcome the problems of the prior art by changing the m/p ratio, the ester ratio of the light-sensitive substance, and the amount of light-sensitive substance added in order to alter the optical density.

SUMMARY OF THE INVENTION

An object of the present invention is to provide a micropattern-forming material that has excellent dry-etching resistance, is capable of development with alkali aqueous solution, has high resolving power, and provides good rectangular profile.

Another object of the present invention is to provide a micropattern-forming process using the micro-pattern forming material.

The present inventors have surprisingly found that a micropattern having a rectangular section with no tailing can be formed with deep UV at around 250 nm and a resist comprised of a m/p-cresol novolak resin and a quinonediazide compound where the resist exhibits no marked decrease in optical density around 250 nm.

One object of the present invention has been attained by a micropattern-forming, light-sensitive resin composition which comprises: (a) a novolak resin comprising a condensate between formaldehyde and a mixture of m-cresol and p-cresol (in which a charging weight ratio of m-cresol to p-cresol used at the preparation of the condensate is from 45/55 to 60/40, hereinafter referred to as charging weight ratio), wherein the novolak resin has the following characteristics: (i) a dissolving rate of 20 to 800 Å/sec in an aqueous solution of tetramethylammonium hydroxide (TMAH) and an alkali activity of 0.131N, (ii) a weight average molecular weight of 1000 to 6000 calculated as polystyrene equivalent, and (iii) a non-exposed dissolving rate of equal to or more than 100 Å/sec in an aqueous solution of TMAH with an alkali activity of 0.262N; (b) a light sensitive substance of 1,2-naphthoquinonediazide-4-sulfonyl ester; and (c) a solvent capable of dissolving the novolak resin and the light-sensitive substance; where the novolak resin, the light sensitive substance, and the solvent are present in such amounts that a 1.0 micron thick resist formed of the material has an optical density at 382 nm of 0.1 to 0.4 $\mu m^{-1}$.

Another object of the present invention has been attained by a micropattern-forming process which comprises the steps of (1) spin coating a substrate with a light-sensitive resin composition which comprises (a) a novolak resin comprising a condensate between formaldehyde and a mixture of m-cresol and p-cresol with a m-cresol to p-cresol charging weight ratio of from 45/55 to 60/40, where said novolak resin has the following characteristics: (i) a dissolving rate of 20 to 800 Å/sec in an aqueous solution of tetramethylammonium hydroxide (TMAH) and an alkali activity of 0.131N, (ii) a weight average molecular weight of 1000 to 6000 calculated as polystyrene equivalent, and (iii) a non-exposed dissolving rate of equal to or more than 100 Å/sec in an aqueous solution of TMAH with an alkali activity of 0,262N; (b) a light sensitive substance of 1,2-naphthoquinonediazide-4-sulfonyl ester; and (c) a solvent capable of dissolving said novolak resin and said light-sensitive substance; where said novolak resin, said light sensitive substance, and said solvent are present in such amounts that a 1.0 micron thick resist formed of the material has an optical density at 382 nm of 0.1 to 0.4 $\mu m^{-1}$; (2) drying said light sensitive composition from step (1); (3) irradiating said dried light sensitive composition from step (2) using deep UV having a wavelength not longer than about 320 nm, preferably about 250 nm, through a mask; (4) developing said exposed light sensitive composition from step (3) with an aqueous solution of tetramethylammonium hydroxide having an alkali activity of 0.05 to 0.23N.

DETAILED DESCRIPTION OF THE INVENTION

The present invention is now described in more detail below.

JP-A-55-57841, JP-A-60-57339, JP-A-60-159846 (corresponding to U.S. Pat. No. 4,863,829), JP-A-62-270951, JP-A-62-35347 (corresponding to U.S. Pat. No. 4,731,319), JP-A-62-35349, etc. disclose that cresol novolak resins having various m/p ratios are useful as constituents of positive resists. However, none of them suggests that they are adaptable to lithography using deep UV having a wavelength not longer than 320 nm. As well known in the art, these novolak resins and naphthoquinonediazide compounds show large absorptions at around 250 nm and this appears to be a barrier to micropattern formation. More specifically, the m/p-novolak resins generally used show absorption of about 0.6 to 0.7 $\mu m^{-1}$ at a wavelength of about 250 nm (e.g., 248 nm), and the naphthoquinonediazide compounds also show absorption of about 0.5 to 0.7 $\mu m^{-1}$ at that wavelength even after the compounds have been completely bleached. Thus, the irradiated light is absorbed substantially near the surface of the light sensitive composition and does not reach the bottom of the composition in a sufficient amount to form a fine pattern by photodecomposition. Contrary to this, the present inventors have confirmed that with the compounds of the invention, while photo bleaching effectively takes place at exposure wavelength in g line exposure, it scarcely takes place during exposure with deep UV and a large absorption gradient does not result. Because the chemistry of exposure at the different wavelengths has not been clarified, an explanation of this phenomenon is not possible. Nevertheless, the resist composition in accordance with the present invention provides a pattern having a well rectangular profile with perpendicular walls. It must be noted that the disclosure in the previous references teach away from the present invention.

When the content of the m component of the novolak resin in accordance with the present invention increases to a degree exceeding m/p=60/40, a pattern profile not having the desired rectangular section results. On the other hand, when the content of the m component is decreased less than m/p=45/55, a tapered pattern results and, in some cases, the lower part of such resist is not completely developed.

The light-sensitive substance used in the present invention is a 1,2-naphthoquinonediazide-4-sulfonic acid ester. This is an ester compound of 1,2-naphthoquinonediazide-4-sulfonyl chloride (hereinafter abbreviated as DM-Cl) and at least one of the polyhydroxy compounds of the structural formulae given below. A light-sensitive substance with any esterification ratio can be obtained by changing the reaction ratio of the two reactants. The resulting esterification product is a mixture of esters different from each other in esterification number and esterification position. Hence, the esterification ratio is presented as an average of these values.

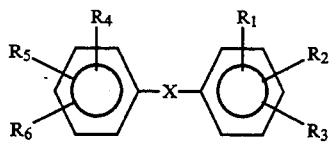
(I)

In the above formula, X represents

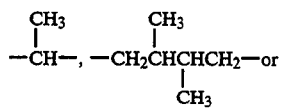

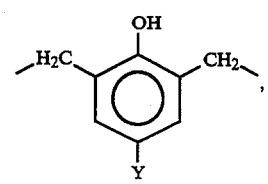

Y represents a hydrogen atom or an alkyl group, and at least one of $R_1$ to $R_6$ represents a hydroxyl group and the rest independently represent a hydrogen atom, an alkyl group or an aryl group.

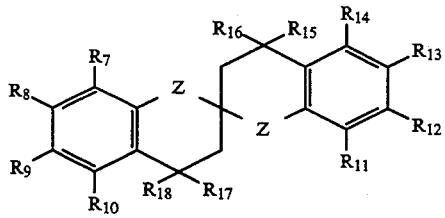
(II)

In the above formula, at least one of $R_7$ to $R_{14}$ represents a hydroxyl group, and the rest independently represent a hydrogen atom, an alkyl group or an aryl group, $R_{15}$, $R_{16}$, $R_{17}$ and $R_{18}$, which may be the same or different, each represents a hydrogen atom or an alkyl group, and Z represents a single bond or an oxygen atom.

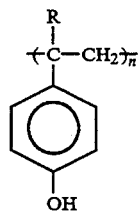
(III)

In the above formula, R represents a hydrogen atom or a methyl group, and the compound has a weight average molecular weight of 100 to 5000.

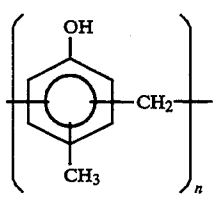
(IV)

The compound of the above formula has a weight average molecular weight of 100 to 5000, and a m-cresol/p-cresol ratio of from 40/60 to 70/30.

Specific non-limiting examples of the abovementioned polyhydroxy compounds are illustrated below.

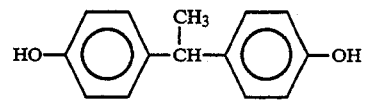

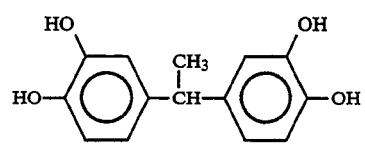

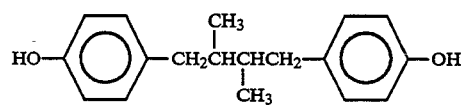

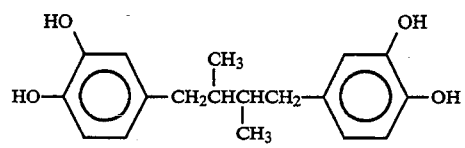

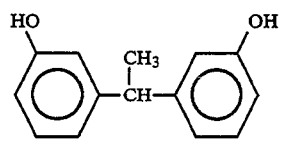

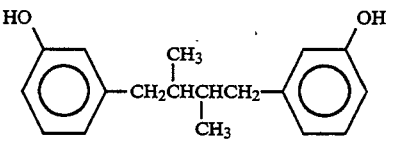

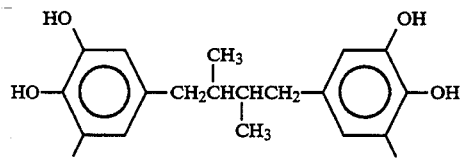

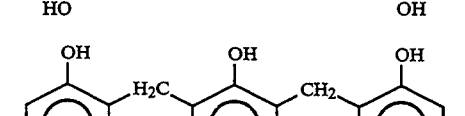

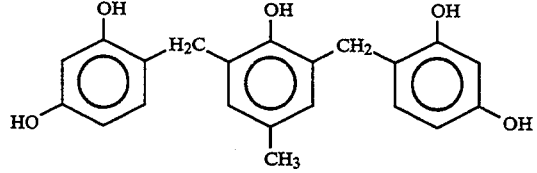

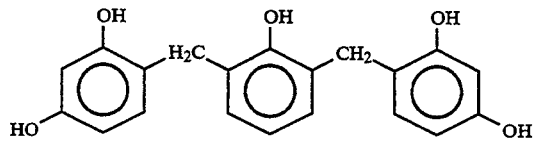

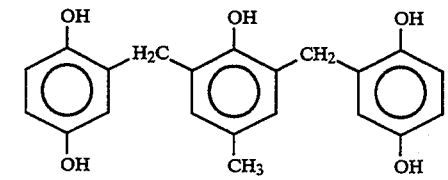

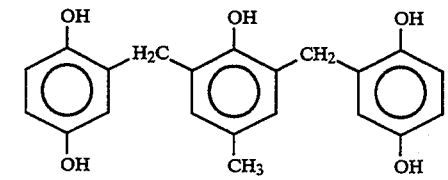

-continued

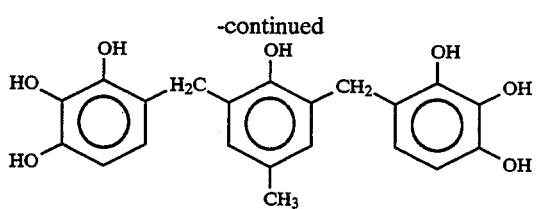
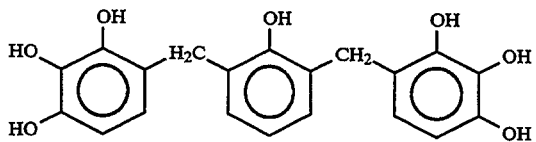
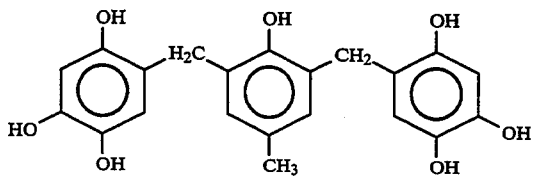
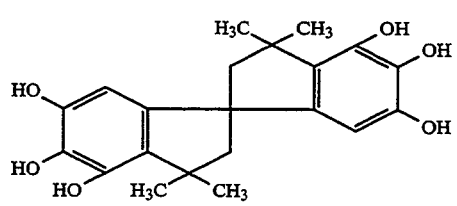
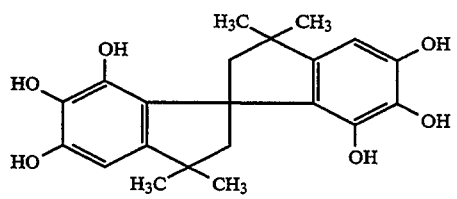
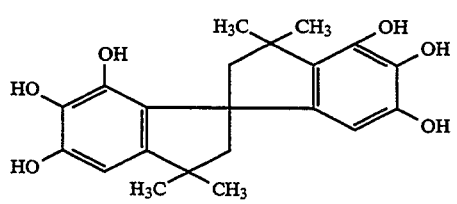
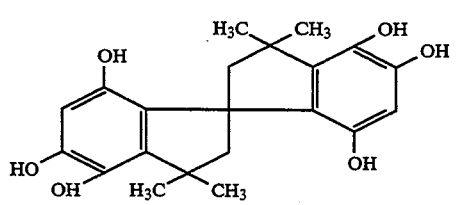
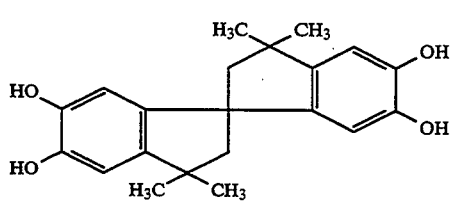
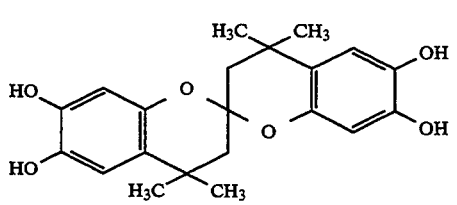

-continued

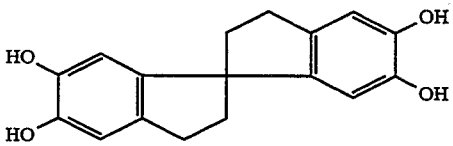

The light-sensitive substance is added to the novolak resin solution in such an amount that the resulting resist film has a normalized thickness of 1.0 μm and an optical density at 382 nm of 0.1 to 0.4 μm$^{-1}$, preferably 0.16 to 0.38 μm$^{-1}$.

It is widely accepted that there is some relation between the inhibition effect resulting from the mutual action between the novolak resin and the light-sensitive substance that results in the desired pattern profile. When the light-sensitive substance is added in an amount exceeding the above-specified optical density, however, an increase in this mutual effect results, which increases the absorption on the resist surface. While contrast is improved to some extent, only a seriously deteriorated profile is obtained. In addition, if more light sensitive substance is added, it tends to be precipitated thereby causing coating troubles. Thus, an additional amount is not favorable.

On the other hand, if only enough light-sensitive substance is added so that an optical density of less than 0.1 μm$^{-1}$ results, a pattern with a rectangular profile is not obtained, rather, a pattern with a tapered profile results.

The light-sensitive composition is required to show an alkali solution rate of 100 Å/sec or more in an unexposed state in a TMAH aqueous solution having an activity of 0,262N. If the dissolving rate is less than this, a tapered profile pattern exhibiting poor perpendicularity of side walls results.

As an additional component of the light sensitive resin composition, a solvent which is capable of dissolving the novolak resin and the light-sensitive substance, and which does not react with them is used. Solvents, that facilitate formation of the film on a base board without particular limitations regardless of the coating method are desired. In consideration of these factors as well as workability, toxicity, and safety, solvents such as the cellosolves (such as ethylcellosolve acetate (ECA) and mehylcellosive acetate (MCA)), alcohol esters (such as ethylcellosolve (EC) and methylcellosolve (MC)), fatty acid esters (such as methyl lactate and ethyl lactate), ketones (such as cyclohexanone), and polar solvents (such as dimethylacetamide (DMAC), dimethylsulfoxide (DMSO) and N-methylpyrrolidone (NMP)) are preferably used. These solvents may be used alone or as a mixture of two or more of them. In some cases, a poor solvent or a non-solvent may be added without spoiling the solubility and coating properties of the light-sensitive composition.

In addition, an adhesive aid may be added for improving adhesion to a substrate, a surfactant or the like for the purpose of preventing striation or improving coating properties, and a dye or an ultraviolet ray absorbent for preventing halation when a highly reflective substrate is used. The amounts of these additives can properly be selected by those skilled in the art in consideration of the other properties of the invention.

In forming an image using the pattern-forming materials of the present invention, a TMAH aqueous solution is used for development after exposure. The alkali activity of an aqueous developing solution is from 0.05 to 0.23N, preferably 0.10 to 0.19N. A dilute developing solution with an alkali activity of less than 0.05N, in some cases, fails to develop or can develop only the upper part with leaving the lower part undeveloped and, in such a case, even when development takes place, only a tapered pattern results.

If the alkali activity of the developing solution exceeds 0.23N, a pattern profile where the resist top portion is roundish results. In addition, although sufficient sensitivity is attained, resolving power tends to be reduced.

Various surfactants may be added to the developing solution to decrease surface tension and improve the wetting properties of the resist surface. An organic solvent such as an alcohol capable of dissolving the resist and miscible with water may also be added in a small amount for the purpose of removing scum or improving other developing properties.

A general method of using the pattern-forming material of the present invention comprises spin-coating the material on a semiconductor substrate, drying it on a hot plate or in an oven to remove the solvent and form a film having a predetermined thickness, irradiating it with actinic rays through a given mask, and conducting development for a predetermined period of time according to a still puddling method or a dipping method using the aforesaid alkali developer to obtain a desired pattern.

As has been described above, the present invention enables one to form a finepattern having a rectangular profile in a conventional manner in a single-layer process without employing a multi-layer process and without excess steps before or after the exposing step. Needless to say, an improved pattern can be obtained by providing additional steps such as an alkali treatment or a heating treatment before or after the exposing step.

The present invention is now illustrated in greater detail by reference to the following examples which, however, are not to be construed as limiting the present invention in any way.

EXAMPLES

1) Properties of various novolak resins and adaptability to the present invention Table 1 shows the properties of various novolak resins and their adaptability to the present invention.

The alkali dissolving rate was measured according to the following method.

An ECA solution having a resin concentration of 30% by weight was prepared, and filtered through a 0.4-$\mu$m membrane filter to prepare a coating solution. This coating solution was spin-coated in a film thickness of 1.2 $\mu$m on a 4-inch silicon wafer, then dried at 100° C. for 90 seconds on a hot plate. The dissolution rate of this coated layer was measured by means of Development Rate Monitor made by Perkin-Elmer Corporation using a TMAH aqueous solution having an alkali activity of 0.131N as a developer. The dissolving rate is presented in terms of an average film reduction amount per second (Å/sec).

TABLE 1

Properties of various novolak resins and adaptability to the present invention

| Novolak No. | m/p | Mw | Alkali Dissolving Rate | Adaptability to Present Invention |
|---|---|---|---|---|
| N1 | 30/70 | 2060 | 12 Å/sec | X |
| N2 | 30/70 | 3200 | <5 | X |
| N3 | 40/60 | 3880 | <3 | X |
| N4 | 40/60 | 5200 | <3 | X |
| N5 | 40/60 | 6500 | <3 | X |
| N6 | 45/55 | 3750 | 279 | O |
| N7 | 45/55 | 4000 | 270 | O |
| N8 | 45/55 | 4300 | 250 | O |
| N9 | 45/55 | 10500 | <5 | X |
| N10 | 50/50 | 3380 | 180 | O |
| N11 | 50/50 | 5000 | 43 | O |
| N12 | 50/50 | 3000 | 376 | O |
| N13 | 50/50 | 5110 | 38 | O |
| N14 | 50/50 | 3810 | 103 Å/sec | O |
| N15 | 50/50 | 7900 | <5 | X |
| N16 | 53/47 | 3300 | 280 | O |
| N17 | 60/40 | 12100 | <5 | X |
| N18 | 60/40 | 6650 | 9 | X |
| N19 | 60/40 | 4690 | 120 | O |
| N20 | 60/40 | 3520 | 437 | O |
| N21 | 60/40 | 1800 | 900 | X |
| N22 | 70/30 | 2580 | 676 | X |
| N23 | 70/30 | 5790 | 69 | X |
| N24 | 70/30 | 8700 | 15 | X |

O: adapted  X: not adapted

EXAMPLE 1

1 Synthesis of light-sensitive substance 3 g of the polyhydroxy compound shown below, 11.4 g of DM-Cl and 70 ml of gamma-butyrolactone were charged in a 300-ml three-necked flask. The mixture was made into a uniform solution which maintaining the outer temperature at 12° to 16° C.

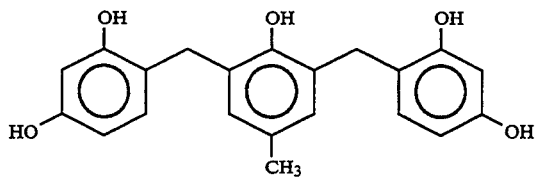

A mixed solution composed of 5.7 g of 4-dimethylaminopyridine (hereinafter "4DMAP") and 70 ml of acetone was dropwise added to this solution, and then the resulting mixture was allowed to react over a period of 3 hours. After the pH value of the reaction mixture became constant, the mixture was allowed to stand for about 20 minutes to terminate the reaction. After completion of the reaction, the reaction solution was poured into 1 liter of a 0.01 wt % HCl aqueous solution, and the resulting precipitate was collected by filtration. The precipitate thus obtained was washed with deionized distilled water, and then filtered. This procedure was repeated three times. Thereafter, the precipitate was dried for 24 hours in a 40° C. vacuum drier to obtain 11 g of 1,2-naphthoquinonediazidesulfonic acid ester of the above-described polyhydroxy compound (A) having a purity of about 95% by HPLC (High Performance Liquid Chromatography).

2) Preparation of light-sensitive composition

An ECA solution containing 30 wt % of novolak resin N6 given in Table 1 was prepared. This showed a dissolving rate of 279 Å/sec measured in a 0,131N TMAH aqueous solution. To this novolak resin solution was added the above-described light-sensitive substance (A) in an amount of 10% by weight based on total solids. After adjusting the concentration of total solids to 26% by weight, the mixture was filtered through a filter of 0.2 μm pores to obtain a light-sensitive composition. This composition had an optical density of 0.32 μm$^{-1}$ and showed an alkali dissolving rate of 315 Å/sec in a 0.262 N TMAH aqueous solution before exposure.

3) Evaluation

A clean 3-inch silicon wafer was treated with hexamethylsilazane, spin-coated with the above-described light-sensitive composition and dried at 100° C. for 90 seconds on a hot plate. The thus-formed resist film had a thickness of 0.8 μm. This film was exposed using, a contact aligner having a low-pressure mercury lamp light source and a band-pass filter capable of transmitting light of 254 nm in wavelength. Light intensity on the irradiated surface was 1.68 mw/cm$^2$. Exposure was conducted in the hard contact mode through a quartz-made test chart mask having a desired pattern (made by Dai-Nippon Printing Co., Ltd.) to form a latent image. Still puddling development was conducted for 60 seconds using a TMAH aqueous solution with an alkali activity of 0.131N. The Eth sensitivity of the final product was measured to be 90 mJ/cm$^2$, and the resolving power of the sample was found to be 0.7 μml/s. Scanning electron microscope (SEM) observation revealed that the resulting pattern had a well rectangular profile with almost perpendicular walls and absolutely no tailing. Taper angle was measured from the SEM photograph to be 89°. The film-remaining ratio was 99.8%.

EXAMPLE 2

1) Synthesis of light-sensitive substance 4.6 g of a polyhydroxy compound shown below and 20.0 g of DM-Cl were uniformly dissolved in 100 ml of gamma-butyrolactone, and a solution of 9.8 g of 4DMAP in 70 ml of gamma-butyrolactone was added dropwise thereto.

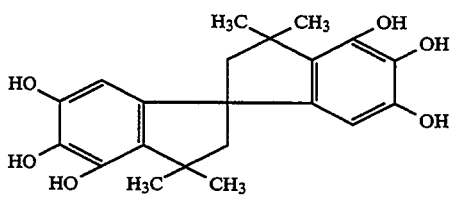

After reacting for 3 hours, subsequent procedures were conducted in the same manner as in Example 1 to obtain 19.7 g of 1,2-naphthoquinonediazide-4-sulfonic acid ester of the above-described polyhydroxy compound (B) having a purity of about 90% by HPLC.

2) Preparation of light-sensitive composition and its evaluation

Light-sensitive substance (B) was added to the novolak resin solution prepared as in Example 1 in an amount of 10% by weight based on total solids. The resulting composition had an optical density of 0.25 μm$^{-1}$, and an alkali dissolving rate of 263 Å/sec. as measured in the same manner as in Example 1.

A resist film was prepared and evaluated in the same manner as in Example 1. Thus, Eth sensitivity and resolving power were measured to be about 100 mJ/cm$^2$ and 0.7 μm, respectively. The resulting pattern had a section wherein the upper part was almost perpendicular though a slight tailing was observed at the bottom, and a good taper angle of 88°.

EXAMPLE 3

3 g the polyhydroxy compound shown below was reacted with 11.6 g of DM-Cl to synthesize light-sensitive substance (C).

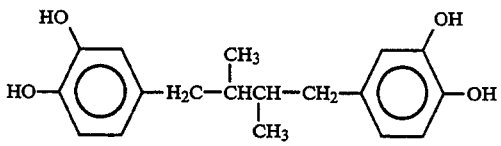

The resulting light-sensitive substance (C) was added to novolak resin N10 in an amount of 12% by weight based on the total solids. The resulting composition showed an optical density of 0.31 μm$^{-1}$, and showed an alkali dissolving rate of 390 Å/sec before exposure. A coating film was formed, then exposed and developed in the same manner as in Example 1. The resolving power was found to be 0.7 μm, and the film-remaining ratio was 98.5%. Observation of the section of the formed pattern by SEM revealed that the pattern had almost perpendicular walls having a taper angle of 88°.

EXAMPLE 4

5.0 g of cresol novolak resin having a polystyrene-reduced, weight-average molecular weight of 1720 and a charging ratio of m-cresol to p-cresol of 60/40 and 1.2 g of DM-Cl were reacted with each other using 4DMAP as a catalyst. Subsequent processing was conducted in the same manner as in Example 1 to obtain polymer-type light-sensitive substance (D). Novolak resins N11, N12 and N20 were mixed at a weight proportion of 5%, 45% and 50%, respectively, to obtain a novolak resin solution showing a dissolving rate of 275 Å/sec in a 0,131N TMAH aqueous solution. To this was added the above light-sensitive substance (D) to obtain a light-sensitive composition containing 27% by weight of total solids. This composition showed an optical density of 0.32 μm$^{-1}$, and an alkali dissolving rate of 270 Å/sec before being exposed. A coating film was formed in the same manner as in Example 1 and, after exposure, still puddling development was conducted for 60 seconds in a 0,131N TMAH aqueous solution. Analysis of the final product showed resolving power to be 0.7 μm with a film-remaining ratio of 99%. The Eth sensitivity was found to be about 150 mJ/cm$^2$. Observation of the section of the formed pattern by SEM revealed that the taper angle was 87°, and that a profile with a good rectangularity was provided.

EXAMPLE 5

Polyhydroxystyrene having a weight-average molecular weight of about 2000 was reacted with DM-Cl in the same manner as described in Example 1 to obtain a polymer-type light-sensitive substance (E). As the novolak resin, novolak resins N13 and N20 were mixed with each other to prepare a novolak resin showing a dissolving rate of 250 Å/sec in a 0.131N TMAH aqueous solution. To this was added the above-mentioned light-sensitive substance (E) to prepare a light-sensitive composition containing 27% by weight of solids in the same manner as described in Example 1. Optical density of the composition was measured to be 0.32 μm$^{-1}$, and alkali dissolving rate thereof was found to be 380 Å/sec before being exposed. Coating procedure, exposing procedure and developing procedure were conducted in the same manner as in Example 1 to obtain a pattern. The resolving power was found to be 0.7 μm, and the film-remaining ratio was 98.3%. Eth sensitivity was 120 mJ/cm². Observation of the section of the pattern by SEM revealed that the pattern was rectangular with a taper angle of 87°. Although a slight tailing was observed near the bottom, the bottom taper angel was 80°, and thus good performance was obtained.

EXAMPLE 6

A polyhydroxy compound shown below was reacted with DM-Cl in a charged molar ratio of 1:7 to obtain light-sensitive substance (F).

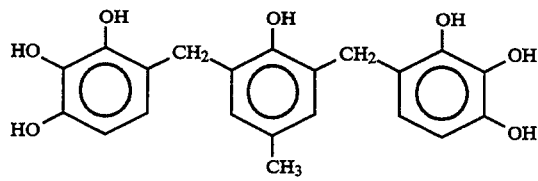

A light-sensitive composition having an optical density of 0.33 μm⁻¹ was prepared using the aforementioned novolak resin N16. The alkali dissolving rate of the light-sensitive substance was 153 Å/sec before being exposed. Evaluation in the same manner as in Example 1 revealed that the Eth sensitivity was about 120 mJ/cm² the film-remaining ratio was 98.3% and the resolving power was 0.7 μm. A pattern having a rectangular profile of 84° in taper angle was obtained.

EXAMPLE 7

A light-sensitive composition was prepared in the same manner as in Example 6 but using novolak resin N8 shown in Table 1, instead of the novolak resin N16 used in Example 6. The resulting light-sensitive composition was evaluated as described in Example 1. There was obtained a pattern having a rectangular profile of 85° in taper angle. The resolving power was 0.7 μm, the Eth sensitivity was 100 mJ/cm², and the film-remaining ratio was 99.2%.

EXAMPLE 8

A mixed solution having a dissolving rate of about 280 Å/sec was prepared using N12 and N15 shown in Table 1 as novolak resins at a weight ratio of 85% and 15%, respectively. A light-sensitive composition having an optical density of 0.29 μm⁻¹ was prepared using the light-sensitive substance (A) prepared in Example 1. Evaluation was conducted in the same manner as in Example 1. Thus, the alkali dissolving rate before exposure was found to be 220 Å/sec, the resolving power was 0.7 μm, and the film-remaining ratio was 99.3%. The pattern had a rectangular section with a taper angle of 87°.

As is apparent from this example, Novolak N15 which is outside the scope of the present invention with respect to molecular weight and alkali dissolving rate may be used by mixing with other preferable novotak resins.

EXAMPLE 9

The light-sensitive composition prepared in Example 1 was coated on a silicon wafer to form a film having a thickness of 0.5 μm, and the resulting film was prebaked using a hot plate. In order to evaluate differences in the profile caused by post-exposure baking, two samples of the film were evaluated under the following different baking conditions:

| Baking | Sample (1) | Sample (2) |
| --- | --- | --- |
| Prebaking | at 100° C. for 90 sec. | at 90° C. for 60 sec. |
| Post-exposure Baking | — | at 100° C. for 60 sec. |

That is, the coated film was imagewise exposed to a light having a wavelength of 248 nm using KrF excimer laser stepper of NA=0.42. After exposure, only Sample (2) was further subjected to heat-treatment at 100° C. for 60 seconds using a hot plate (post-exposure baking). Thereafter, the both samples were paddle developed with an aqueous alkali solution (a 0.131N TMAH aqueous solution). The results obtained are shown below.

| | Sample (1) | Sample (2) |
| --- | --- | --- |
| Eth Sensitivity (mJ/cm²) | 50 | 40 |
| Resolving Power (μm) | 0.35 | 0.30 |
| Taper Angle (degree) | 85° | 87° |
| Film-Remaining Ratio | 99.7 | 99.8 |

As is noted from the above results, Samples (1) and (2) showed the resolving power of fine pattern, i.e., 0.35 μm and 0.30 μm, respectively, and showed excellent profile of 85° C. or more which is near perpendicular walls.

COMPARATIVE EXAMPLE 1

A light-sensitive composition having an optical density of 0.31 μm⁻¹ was prepared using N18 shown in Table 1 as the novolak resin and the light-sensitive substance (A) of Example 1 as the light-sensitive substance. Evaluation was conducted in the same manner as in Example 1. Thus, the alkali dissolving rate before exposure was found to be 80 Å/sec, the Eth sensitivity was as large as 600 mJ/cm² or more, the resolving power was 1.0 μm, and the film-remaining ratio was 100%. Thus the sample was less sensitive than samples made according to the present invention. Observation of the profile by SEM revealed that the section fanned out toward the bottom, and the taper angle was about 70°.

COMPARATIVE EXAMPLE 2

A novolak resin solution showing an alkali dissolving rate of about 300 Å/sec was prepared by mixing novolak resin N22 with novolak resin N23 (N22:N23=40:60 by weight). To this was added the light-sensitive substance (A) to prepare a light-sensitive composition having an optical density of 0.33 μm⁻¹. Evaluation was conducted in the same manner as in Example 1. The alkali dissolving rate before exposure was found to be 390 Å/sec, the Eth sensitivity was 100 mJ/cm², the resolving power was 0.8 μm, and the film-remaining ratio was 97.1%. The resulting pattern had a taper angle of 73° and fanned out toward bottom, not showing a preferred section.

COMPARATIVE EXAMPLE 3

A light-sensitive composition was prepared in the same manner as in Example 1 except that the amount of the light-sensitive substance was increased until the optical density was 0.56 $\mu m^{-1}$, and the resulting composition was evaluated as described in Example 1. The alkali dissolving rate was 110 Å/sec before exposure. The resolving power was 0.7 $\mu m$ which was the same as that of Example 1. However, the Eth sensitivity slightly decreased to 200 J/cm$^2$, and the section fanned out toward the bottom with a taper angle of 70°.

COMPARATIVE EXAMPLE 4

A light-sensitive composition was prepared in the same manner as in Example 1 except that the amount of the light-sensitive substance was decreased in order to change the optical density to 0 07 $\mu m^{-1}$, and the resulting composition was evaluated in the same manner as in Example 1. The alkali dissolving rate was found to be 640 Å/sec before exposure. The Eth sensitivity was found to be 90 mJ/cm$^2$ the resolving power was 1.0 $\mu m$, and the film-remaining ratio was 97.8%. However, the section was seriously deteriorated, showing a taper angle of 68°.

COMPARATIVE EXAMPLE 5

A light-sensitive composition was prepared in the same manner as described in Example 1 by using a 100% p-cresol novolak resin having a molecular weight of 1800 and adding the light-sensitive substance (A) in an amount of 10% by weight based on total solids. This composition had an optical density of 0.24 $\mu m^{-1}$. Evaluation of the composition was conducted in the same manner as in Example 1, and Eth sensitivity was found to be less than 800 mJ/cm$^2$. Further, the alkali dissolving rate of the unexposed portion was 0.2 Å/sec, and almost no reduction of the film was measured. Although the upper part of the pattern was developed, the lower part was not developed, and no resolution was attained.

COMPARATIVE EXAMPLE 6

A light-sensitive substance was synthesized in the same manner as in Example 1 except that the compound shown below having a benzophenone backbone was used as the polyhydroxy compound and the charging ratio of the polyhydroxy compound to DM-Cl was changed to 1:3.

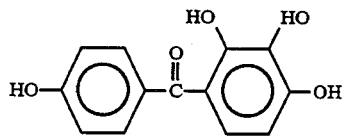

A light-sensitive composition was prepared in the same manner as in Example 1 using the light-sensitive substance. This composition had an optical density of 0.30 $\mu m^{-1}$, and was evaluated in the same manner as in Example 1. Thus, the alkali dissolving rate was found to be 168 Å/sec, the Eth sensitivity was 110 mJ/cm$^2$, the film-remaining ratio was 98.2%, and the resolving power was 0.7 $\mu m$. However, the section fanned out downwared though the upper part was rectangular. Thus, a pattern with perpendicular walls was not obtained.

COMPARATIVE EXAMPLES 7 to 8

A light-sensitive composition of Example 1 was prepared and evaluated in the same manner as in Example 1 except that, for Comparative Example 7, a TMAH aqueous developer solution having an alkali activity of 0,262N was used and the developing time was changed to 40 seconds. In Comparative Example 7, the Eth sensitivity was 30 mJ/cm$^2$, but the pattern had a triangular section of 45° in taper angle, and thus was not practically usable.

On the other hand, for Comparative Example 8, an aqueous solution having an alkali activity of 0.03N was used as a developer. In Comparative Example 8, only the upper part of the pattern was slightly developed, and sufficient development to permit evaluation was impossible.

COMPARATIVE EXAMPLE 9

A light-sensitive substance was synthesized in the same manner as in Example 4 except that instead of DM-Cl 1,2-naphthoquinonediazide-5-sulfonyl chloride was used. The resulting material was evaluated in the same manner as in Example 4. Although the film-remaining ratio was 99.0% and the resolving power was 0.7 $\mu m$, the Eth sensitivity was 400 mJ/cm$^2$. In addition, the pattern showed a triangular profile of 70° in taper angle, and thus was inferior to the material of Example 4.

COMPARATIVE EXAMPLE 10 to 12

Light-sensitive compositions having an optical density between 0.3 and 0.33 were prepared by combining novolak resin N3 and the light-sensitive substance in Example 1, novolak resin N4 and the light-sensitive substance in Example 2, and novolak resin N5 and the light-sensitive substance in Example 3, respectively. These compositions were evaluated in the same manner as in Example 1, but none of them could be developed.

While the present invention has been described in detail and with reference to specific embodiments thereof, it is apparent to one skilled in the art that various changes and modifications can be made therein without departing from the spirit and the scope of the present invention.

What is claimed is:

1. A micropattern-forming, light-sensitive resin composition which consists essentially of an admixture of:
    (a) a novolak resin consisting essentially of a condensate between formaldehyde and a mixture of m-cresol and p-cresol with a m-cresol to p-cresol charging weight ratio of from 45/55 to 60/40, wherein said novolak resin has the following characteristics:
        (i) a dissolving rate of 20 to 800 Å/sec in an aqueous solution of tetramethylammonium hydroxide (TMAH) and an alkali activity of 0.131N,
        (ii) a weight average molecular weight of 1000 to 6000 calculated as polystyrene equivalent, and
        (iii) a non-exposed dissolving rate of equal to or more than 100 Å/sec in an aqueous solution of TMAH with an alkali activity of 0.262N;
    (b) a light-sensitive substance of 1,2-naphthoquinonediazide-4-sulfonyl ester; and
    (c) a solvent capable of dissolving the novolak resin and said light-sensitive substance;
    wherein said novolak resin, said light sensitive substance, and said solvent are present in such amounts that a 1.0 micron thick resist formed of the material has an optical density at 382 nm of 0.1 to 0.4 $\mu m^{-1}$, wherein said light-sensitive substance comprises a condensation reaction product between 1,2-naphthoquinonediazide-4-sulfonyl chloride and at least one of the polyhydroxy compounds represented by the following general formulae (I), (II), (III) and (IV):

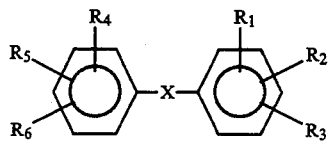  (I)

wherein X represents,

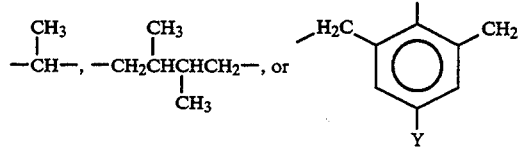

Y represents a hydrogen atom or an alkyl group, and at least one of $R_1$ to $R_6$ represents a hydroxyl group and the rest independently represent a hydrogen atom, an alkyl group or an aryl group;

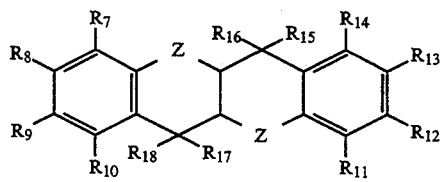  (II)

wherein at least one of $R_7$ to $R_{14}$ represents a hydroxyl group, and the rest independently represent a hydrogen atom, an alkyl group or an aryl group, $R_{15}$, $R_{16}$, $R_{17}$ and $R_{18}$, which may be the same or different, each represents a hydrogen atom or an alkyl group, and Z represents a single bond or an oxygen atom;

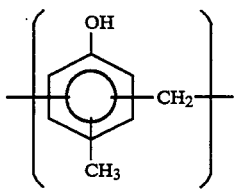  (III)

having a weight average molecular weight of from 100 to 5000 wherein R represents a hydrogen atom or a methyl group;

$$\left(\begin{array}{c}\text{OH}\\ \phantom{x}\\ \text{CH}_3\end{array}\!\!\!\!\!\!\!\!\!\!\!\!\!\!\!\!\!\!\!\!\!\!\!\!\!\!\!\!\!\!\!\!\!\!\!\!-\!\!\text{CH}_2\!-\right) \quad \text{(IV)}$$

having a weight average molecular weight of from 100 to 5000 and a ratio of m-cresol to p-cresol of from 40/60 to 70/30.

2. The micropattern-forming, light-sensitive resin composition as in claim 1, wherein said novolak resin, said light sensitive substance, and said solvent are present in such amounts that a 1.0 micron thick resist formed of the material has an optical density at 382 nm of 0.16 to 0.38 $\mu m^{-1}$.

3. The micropattern-forming, light-sensitive resin composition as in claim 1, wherein said solvent is selected from the group consisting of cellosolves, alcohol esters, fatty acid esters, and ketones.

4. The micropattern-forming, light-sensitive resin composition as in claim 1, wherein the polyhydroxy compound is represented by formula (I).

5. The micropattern-forming, light-sensitive resin composition as in claim 1, wherein the polyhydroxy compound is represented by formula (II).

6. The micropattern-forming, light-sensitive resin composition as in claim 1, wherein the polyhydroxy compound is represented by formula (III).

7. The micropattern-forming, light-sensitive resin composition as in claim 1, wherein the polyhydroxy compound is represented by formula (IV).

* * * * *